United States Patent [19]

Fujino et al.

[11] Patent Number: 5,950,908
[45] Date of Patent: Sep. 14, 1999

[54] SOLDER SUPPLYING METHOD, SOLDER SUPPLYING APPARATUS AND SOLDERING METHOD

[75] Inventors: Junji Fujino; Jitsuho Hirota; Goro Izuta; Akira Adachi, all of Tokyo, Japan

[73] Assignee: Mitsubishi Denki Kabushiki Kaisha, Tokyo, Japan

[21] Appl. No.: 08/768,395

[22] Filed: Dec. 18, 1996

[30] Foreign Application Priority Data

Dec. 25, 1995 [JP] Japan ..................................... 7-337563
Sep. 18, 1996 [JP] Japan ..................................... 8-245824

[51] Int. Cl.$^6$ ............................. B23K 1/00; B23K 3/00
[52] U.S. Cl. ...................... 228/248.1; 228/254; 228/33; 228/41
[58] Field of Search ................ 228/248.1, 254, 228/41, 33; 118/406, 415

[56] References Cited

U.S. PATENT DOCUMENTS

| | | |
|---|---|---|
| 4,720,402 | 1/1988 | Wojcik . |
| 5,211,328 | 5/1993 | Ameen et al. ................. 228/180.2 |
| 5,250,469 | 10/1993 | Tanaka et al. . |
| 5,498,575 | 3/1996 | Onishi et al. . |
| 5,762,259 | 6/1998 | Hubacher et al. ................ 228/254 |
| 5,775,569 | 7/1998 | Berger et al. ................... 228/254 |

FOREIGN PATENT DOCUMENTS 44 38 098 A1  5/1995  Germany .
1-200641  8/1989  Japan ..................................... 228/33
7-85487  9/1995  Japan .

OTHER PUBLICATIONS

Patent Abstracts of Japan abstract of JP–A–7–297196 (Nov. 1995).

Patent Abstracts of Japan abstract of JP–A–1–266987 (Oct. 1989).

Patent Abstracts of Japan abstract of JP–A–7–221104 (Aug. 1995).

Patent Abstracts of Japan abstract of JP–A–6–268017 (Sep. 1994).

Patent Abstracts of Japan abstract of JP–A–7–263450 (Oct. 1995).

*Primary Examiner*—Patrick Ryan
*Assistant Examiner*—Jeffrey T. Knapp
*Attorney, Agent, or Firm*—Sughrue, Mion, Zinn, Macpeak & Seas, PLLC

[57] ABSTRACT

A method of depositing solder paste includes the steps of: superimposing a masking member having a plurality of through-holes and a supporting member on each other so that the supporting member covers the plurality of through-holes; filling cavity portions formed by the plurality of through-holes and the supporting member with solder paste; disposing an LSI chip and the masking member so that electrodes and the cavity portions are superimposed on each other respectively; and heating the solder paste so as to make the solder paste deposit on the electrodes.

15 Claims, 16 Drawing Sheets

SOLDER SUPPLYING METHOD, SOLDER SUPPLYING APPARATUS AND SOLDERING METHOD

BACKGROUND OF THE INVENTION

The present invention relates to a solder supplying method at a joint portion used for soldering electronic components to a printed-wiring substrate or assembling electronic components, an apparatus therefor and a soldering method.

Heretofore, a ball setting method or a solder printing method has been used for supplying solder to external electrodes of an LSI package in order to form bumps (Fen Maeda, "Cream Solder Printing Techniques and Applications for Forming BGA Bumps", Surface Mounting Techniques, Vol. 5, No. 5, 1995, pp.1–6).

On the other hand, a method described in the Examined Japanese Patent Application Publication No. Hei. 7-85487 has been proposed as a bump forming method using solder paste.

FIGS. 22A to 22E are views showing a conventional solder supplying method, for example, as described in the Examined Japanese Patent Application Publication No. Hei. 7-85487. In the drawing, the reference numeral 1 designates a transfer member; 2, holes provided in the transfer member 1; 3, solder paste to be charged into the holes 2 provided in the transfer member 1; and 21, a substrate having metal sites 5.

In such a conventional solder supplying method, the holes 2 provided in the transfer member 1 are filled with solder paste 3 as shown in FIG. 22B and then the metal sites 5 (hereinafter referred to as "electrodes") on the substrate 21 and the holes 2 are aligned as shown in FIG. 22C. Then, the solder paste 3 is heated together with the transfer member 1 so as to flow out to thereby form bumps 7 as shown in FIG. 22D.

In the method disclosed in the Examined Japanese Patent Application Publication No. Hei. 7-85487, as shown in FIG. 22A, the holes 2 of the transfer member 1 do not pass through the transfer member 1 and the holes 2 are formed by drilling. Therefore, if the depths of the holes become different from each other as expressed by holes 2a to 2e in FIG. 23, such a difference directly causes scattering in quantity of solder to be supplied and results in formation of bumps different in height from each other as expressed by bumps 7a to 7e.

Further, because the holes 2 of the transfer member 1 are formed by drilling so as not to pass through the transfer member 1, a longer time is required for drilling to form the holes 2 as the number of bumps 7 increases.

Further, as shown in FIG. 24, because flux (rosin) in a solvent component contained in solder paste is formed as flux residues 8 on the inner walls of the holes 2 after the formation of bumps, a long time is required for cleaning.

Further, a solder material having a high melting point is used in soldered joint portions requiring heat resistance such as soldered joint portions in the inside of an LSI package. When such a high-melting solder material is used for soldering, however, a special member having high heat resistance needs to be used because the quantity of input heat (thermal damage) to peripheral members such as an LSI chip, a printed-wiring substrate, and so on, becomes large.

For example, as disclosed in the Examined Japanese Patent Application Publication No. Hei. 1-266987, there has been proposed a soldering method in which the soldering temperature of a joint portion-requiring high heat resistance is lowered by using in advance solder paste of two kinds of metals having different melting points.

When solder paste of two kinds of metals having different melting points is used in advance, however, coexistence of the two kinds of metals in the paste makes mutual diffusion between the metals progress even at the ordinary temperature in a period of from the point of time when the solder is produced to the point of time when the solder is used. Accordingly, disadvantages such as conglutination of metal particles, or the like, may occur so that the paste cannot be used as solder paste.

In the aforementioned conventional solder supplying method, because the holes 2 to be filled with solder paste 3 are formed by drilling so as not to pass through the transfer member 1, scattering occurs in depth of the holes 2. Accordingly, scattering occurs in height of bumps or a longer time is required for drilling to form the holes 2 as the number of bumps 7 increases. Further, flux (rosin) in a solvent component contained in the solder paste is formed as flux residues 8 on the inner walls of the holes 2 after the formation of bumps.

SUMMARY OF THE INVENTION

The present invention is designed to solve the aforementioned problems and it is an object thereof to provide a solder supplying method and a solder supplying apparatus in which a masking member having through-holes is used to make it possible to form bumps less scattering in height, shorten the time required for cleaning after the formation of bumps and suppress the increase of cost due to the increase of the number of bumps.

In the aforementioned conventional soldering method, because solder paste of two kinds of metals having different melting points is used, mutual diffusion between the metals progresses even at the ordinary temperature. Accordingly, disadvantages such as conglutination of metal particles, or the like, may occur so that the paste cannot be used as solder paste.

The present invention is designed to solve the aforementioned problems and it is another object of thereof to provide of a soldering method in which solder paste containing a first metal having a predetermined melting point and solder paste containing a metal which--is different in melting point from the first metal are used to form bumps to thereby make it possible to lower the soldering temperature of a joint portion requiring high heat resistance.

(1) A solder supplying method according to the present invention comprises the steps of:

superimposing a masking member having a plurality of through-holes corresponding to a plurality of electrodes formed on an electronic component onto a supporting member so that the supporting member covers the plurality of through-holes;

filling cavity portions formed by the plurality of through-holes and the supporting member with solder paste;

disposing the electronic component and the masking member so that the plurality of electrodes are superimposed onto the plurality of cavity portions respectively; and heating the solder paste to make the solder paste deposit on the plurality of electrodes.

(2) A solder supplying method comprises the steps of:

disposing a masking member having a plurality of through-holes corresponding to a plurality of electrodes formed on an electronic component and the electronic component so that the plurality of electrodes are superimposed onto the plurality of through-holes respectively;

filling cavity portions formed by the plurality of through-holes and the electronic component with solder paste;

superimposing a supporting member onto the masking member so that the supporting member covers the plurality of cavity portions; and heating the solder paste to make the solder paste deposit on the plurality of electrodes.

(3) A solder supplying method comprises the steps of:

superimposing a masking-member of a magnetic substance having a plurality of through-holes corresponding to a plurality of electrodes formed on- an electronic component onto a supporting member so that the supporting member covers the plurality of through-holes;

applying magnetic force to the supporting member from its one side opposite to its other side onto which the masking member is superimposed so that the masking member and the supporting member superimposed onto each other are made to adhere closely to each other;

filling cavity portions formed by the plurality of through-holes and the supporting member with solder paste;

disposing the electronic component and the masking member so that the plurality of electrodes are superimposed onto the plurality of cavity portions respectively; and heating the solder paste to make the solder paste deposit on the plurality of electrodes.

(4) A solder supplying method comprises the steps of:

superimposing a masking member of a magnetic substance having a plurality of through-holes corresponding to a plurality of electrodes formed on an electronic component onto a supporting member of a magnetic substance so that the supporting member covers the plurality of through-holes;

applying magnetic force so that the masking member and the supporting member superimposed onto each other are made to adhere closely to each other;

filling cavity portions formed by the plurality of through-holes and the supporting member with solder paste;

disposing the electronic component and the masking member so that the plurality of electrodes are superimposed onto the plurality of cavity portions respectively; and heating the solder paste to make the solder paste deposit on the plurality of electrodes.

(5) A solder supplying apparatus according to the present invention comprises:

a masking member having a plurality of through-holes corresponding to a plurality of electrodes formed on an electronic component;

a supporting member superimposed on the masking member so as to cover the plurality of through-holes;

means for charging solder paste into cavity portions formed by the plurality of through-holes and the electronic component or the supporting member;

means for disposing the masking member and the electronic component so that the plurality of electrodes are superimposed in the plurality of cavity portions or the plurality of through-holes respectively; and a heating means for heating the solder paste to make the solder paste deposit on the plurality of electrodes.

(6) In the above item (5), the supporting member is formed from ceramics.

(7) In the above item (5), the supporting member is a member having permeability of heating beams.

(8) In the above item (7), the solder paste heating means is constituted by a heating beam radiator.

(9) In the above item (5), the supporting member is provided as a heat-resistant sheet-like member, and the means for charging solder paste is provided as means for sticking the sheet-like member onto the masking member and filling cavity portions formed by the plurality of through-holes of the masking member and the supporting member with solder paste.

(10) In the above item (5), the masking member is provided as a member of a magnetic substance so that the apparatus comprises means for giving magnetic force to the masking member from one side of the supporting member opposite to its other side on which the masking member is superimposed to thereby make the masking member and the supporting member adhere closely to each other or in that each of the masking member and the supporting member is provided as a member of a magnetic substance so that the apparatus comprises means for giving magnetic force to the masking member and the supporting member superimposed on each other to thereby make the masking member and the supporting member adhere closely to each other.

(11) In the above item (10), the means for giving magnetic force to thereby make the masking member and the supporting member adhere closely to each other is designed to give magnetic force by using a permanent magnet or an electromagnet.

(12) In the above item (10) or (11), there is provided means for pressing the masking member and the supporting member by using a pressing member to thereby hold a close adhesion state.

(13) In any one of the above items (5) through (12), there is provided a heat-resistant- member disposed between the masking member and the supporting member so as to be filled in a gap between the masking member and the supporting member.

(14) In any one of the above items (5) through (13), the masking member and the supporting member are formed from raw materials different from each other, respectively.

(15) In any one of the above items (5) through (8) and (10) through (13), the supporting member is provided as a member having an opening portion for absorbing the masking member, and the means for charging solder paste is provided as means for evacuating the opening portion to make the masking member and the supporting member adhere closely to each other to thereby charge solder paste into cavity portions formed by the plurality of through-holes of the masking member and the supporting member.

(16) In any one of the above items (5) through (8) and (10) through (15), the supporting member is provided as a member having projecting portions formed at positions corresponding to the plurality of through-holes of the masking member so that no gap is generated in cavity portions formed by the projecting portions and the through-holes when the masking member and the supporting member are superimposed on each other.

(17) In any one of the above items (5) through (8) and (10) through (16), the supporting member is provided as a member having a portion lowered in level correspondingly to an end portion of the masking member so that the end portion of the masking member does not abut on the supporting member when the masking member and the supporting member are superimposed on each other.

(18) In any one of the above items (5) through (8) and (10) through (16), the supporting member is provided as a member having a recess portion to be in contact with the masking member so that no displacement is generated between the masking member and the supporting member when the masking member and the supporting member are superimposed on each other.

(19) A soldering method comprises the steps of:

heating solder paste containing a first metal to make the solder paste deposit onto electrodes of a first electronic component to thereby form bump bases;

heating solder paste containing a second metal different in melting point from the first metal to make the second-mentioned solder paste deposit onto the bump bases on the electrodes of the first electronic component to thereby form bumps;

superimposing the first electronic component and a second electronic component on each other so that respective electrodes of the first and second electronic components correspond to each other; and heating the bumps to make the bumps deposit onto the electrodes of the second electronic component.

(20) In the above item (19); the step of heating the bumps to make the bumps deposit onto the electrodes of the second electronic component includes a step of heating the bumps at a temperature between the melting point of the first metal and the melting point of the second metal and then heating the bumps at a higher temperature than the melting points of the first and second metals so that the electrodes of the first electronic component are joined to the electrodes of the second electronic component.

(21) In the above item (19) or (20), the step of forming the bumps includes a step of heating solder paste containing the second metal which is higher in melting point than the first metal to make the solder paste containing the second metal deposit onto the bump bases on the electrodes of the first electronic component.

(22) In the above item (19) or (20), the step of forming the bumps includes a step of heating solder paste containing the second metal which is lower in melting point than the first metal to make the solder paste containing the second metal deposit onto the bump bases on the electrodes of the first electronic component.

(23) A soldered joint method comprises the steps of:

heating solder paste containing a first metal to make the solder paste deposit onto electrodes of a first electronic component to thereby form first bumps;

heating solder paste containing a second metal different in melting point from the first metal to make the solder paste containing the second metal deposit onto electrodes of a second electronic component to thereby form second bumps;

superimposing the first and second electronic components onto each other so that respective electrodes of the first and second electronic components correspond to each other; and heating one of or both of the first and second bumps so that the electrodes of the first electronic component and the electrodes of the second electronic component are joined to each other.

(24) In the above item (23), the step of joining the electrodes of the first electronic component and the electrodes of the second electronic component to each other includes a step of heating one or both of the first and second bumps at a temperature between a melting point of the first metal and a melting point of the second metal and then heating the bumps at a temperature higher than both of the melting points of the first and second metals so that the electrodes of the first electronic component and the electrodes of the second electronic component are joined to each other.

Figure 1A:
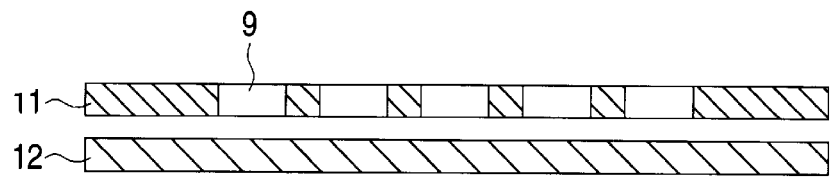
FIGS. 1A to 1E are views showing a solder supplying method according to Embodiment 1 of the present invention.

DETAILED DESCRIPTION OF THE PREFERRED EMBODIMENTS (Embodiment 1)

FIGS. 1A to 1E are conceptual view of a solder supplying method according to Embodiment 1.

The masking member 11 is a 50 mm×50 mm×0.15 mm SUS plate having 1024 through-holes 9 of a 0.4 mm diameter (0.5 mm pitch, 32×32 matrix) formed in the central portion by etching. The supporting member 12 is a 50 mm×50 mm×3 mm SUS plate. Further, the LSI chip 6 is a dummy chip having aluminum wiring formed on a 16 mm×16 mm×0.4 mm silicon wafer. On a surface of the LSI chip 6, 1024 electrodes 5 are surface-treated with titanium-tungsten, nickel and gold.

Figure 1B:
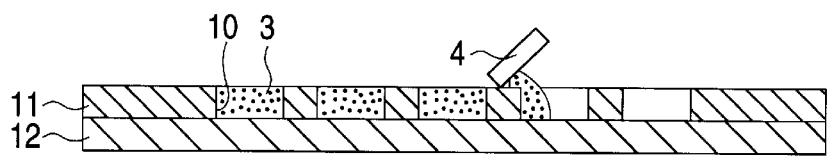
Figure 1C:
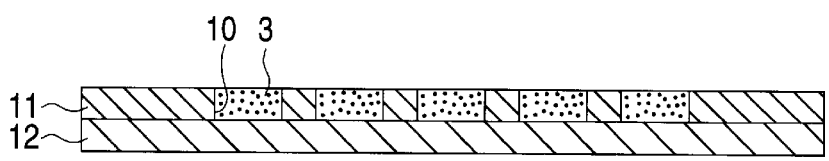
Figure 1D:
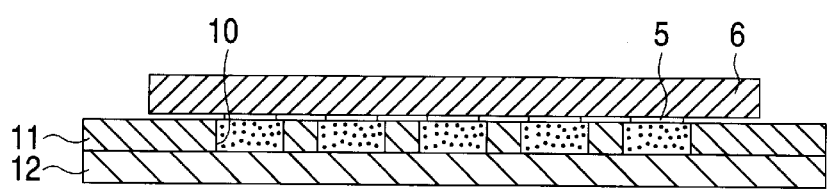
Figure 1E:
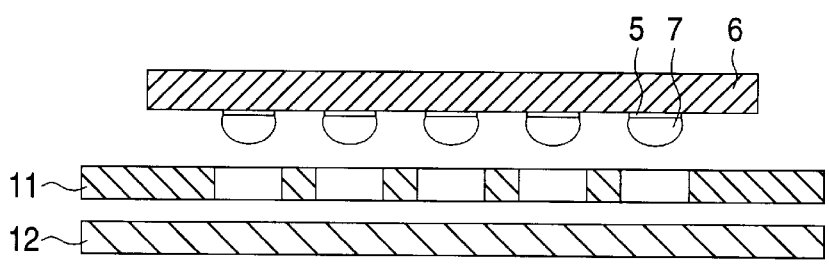

As shown in FIG. 1A, the masking member 11 and the supporting member 12 are superimposed one each other and fixed and, as shown in FIG. 1B, cavity portions 10 are filled with solder paste 3 (63GK-110GP-L, 63Sn-37Pb eutectic type, melting point 183° C., made by Nihon Genma) by using a squeegee 4. Then, as shown in FIG. 1D, the electrodes 5 of the LSI chip 6 and the cavity portions 10 are aligned and heated by using a hot plate heated to 240° C., so that the solder paste 3 is heated/melted to make the electrodes 5 wet with solder to thereby form bumps 7 as shown in FIG. 1E.

Although the thickness of the masking member 11 used in this embodiment is 0.15 mm, any failure in formation of bumps can be suppressed by designing the height of the solder paste 3 to be larger than the mask thickness when the charged solder paste 3 is melted and shaped like a sphere.

Further, the solder paste 3 can be prevented from projecting out at the time of charging by inserting or sticking a sheet-like member such as polyimide tape, etc. having heat resistance and elasticity, an-adhesive agent, or the like, between the masking member 11 and the supporting member 12.

Although this embodiment has shown the case where the SUS masking member 11 and the SUS supporting member 12 are used, the invention is not limited thereto and any material such as aluminum, or the like, which is hardly wet with solder is suitable.

Although this embodiment has shown the case where the through-holes 9 are formed by etching, any method such as drilling, electric discharging, laser ablation, or the like, is suitable.

Although this embodiment has shown the case where the masking member 11 is formed by providing through-holes 9 in a plate material, the masking member 11 can be produced by lamination using plating in the same manner as an additive mask used in solder printing.

Further, with respect to the heating method using such a hot plate, high-precision solder can be also supplied by heating using a reflowing furnace.

Figure 2:
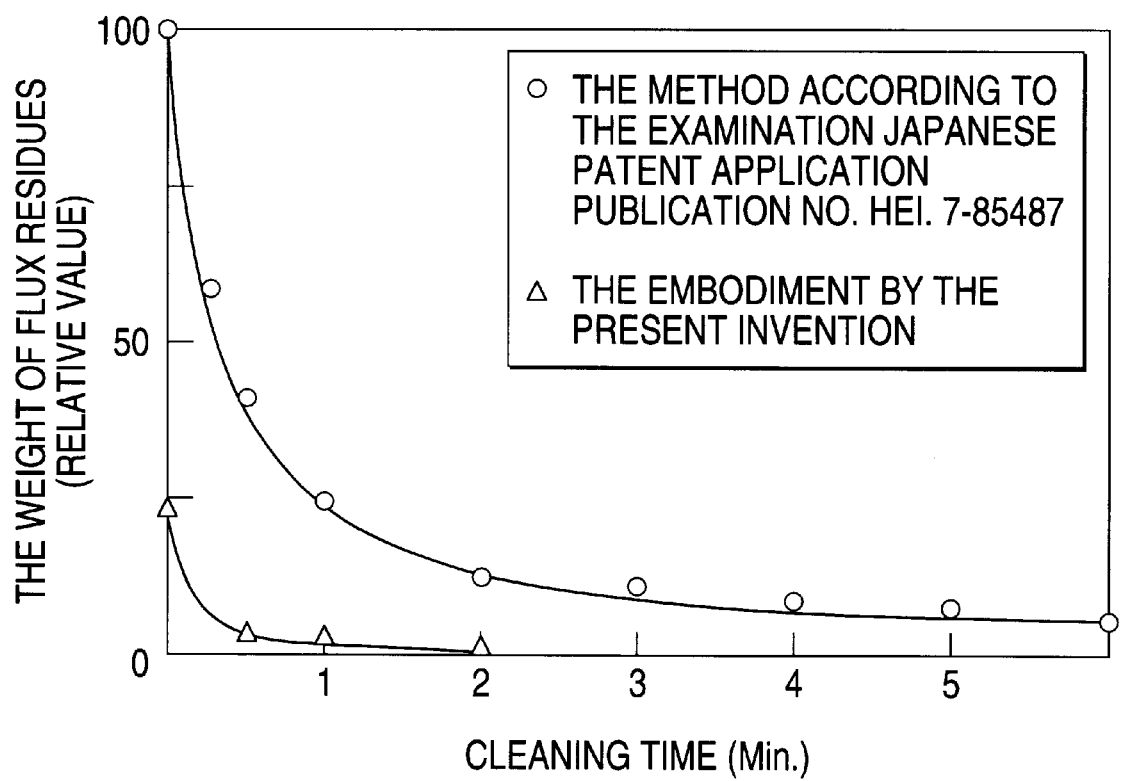
FIG. 2 is a view showing an effect with respect to cleaning characteristic according to Embodiment 1 of the present invention.

FIG. 2 shows results of a comparative experiment in which the cleaning characteristic of the masking member 11 used in this embodiment is compared with the cleaning characteristic of the transfer member 1 used in the method according to the Examined Japanese Patent Application Publication No. Hei. 7-85487 in FIG. 14.

The transfer member 1 prepared here has 1024 cavities of having a 0.4 mm diameter and a 0.15 mm depth (actually measured value: 0.14 mm±0.01 mm) formed by drilling in a 50 mm×50 mm×3 mm SUS plate.

In the case where the masking member 11 and the transfer member 1 are immersed in acetone heated to 40° C. and cleaned ultrasonically after bumps 7 are formed by the respective methods, the cleaning time and the quantity of the flux residue (each of which is a relative value upon the assumption that the value just after the bump formation of the transfer member is 100) are compared.

According to this comparative experiment, the quantity of the flux residue just after the bump formation in the method of this embodiment is only about 20% compared with that in the method of the Examined Japanese Patent Application Publication No. Hei. 7-85487 so that the cleaning time required for obtaining a reusable state can be shortened.

It is thought of that this is because flux residues are apt to be deposited on the neighborhood of the bottoms of the cavities of the transfer member 1 whereas flux residues are hardly deposited in neighborhood of the through-holes and a cleaning agent spreads sufficiently in the through-holes at the time of cleaning.

Further, when the heights of the bumps thus formed are measured, the average and the standard deviation in the case of the method according to the Examined Japanese Patent Application Publication No. Hei. 7-85487 are 223 $\mu$m and 9.2 $\mu$m respectively. On the contrary, it is found that, in the method of this embodiment, the average and the standard deviation are 231 $\mu$m and 7.2 $\mu$m respectively and that the heights of bumps can be controlled with high precision.

Although this embodiment has shown the case where the SUS masking member 11 is used as it is, the surface of the masking member may be coated with fluororesin to a thickness of about 10 $\mu$m so that the masking member can be prevented from being wet with solder and that the cleaning time can be shortened.

Further, in the case of an aluminum masking member, the surface thereof may be treated to form alumite so that cleanability and durability can be improved.

(Embodiment 2)

FIG. 3 is a conceptual view of a solder supplying method according to Embodiment 2.

Figure 3A:
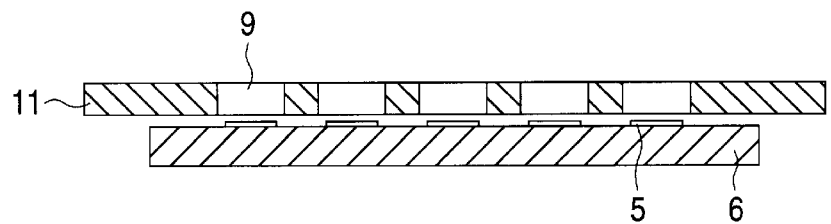
FIGS. 3A to 3E are views showing a solder supplying method according to Embodiment 2 of the present invention.
Figure 3B:
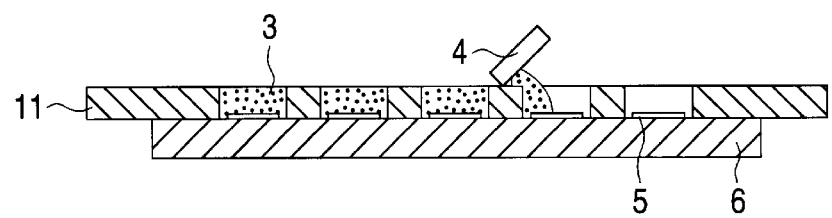
Figure 3C:
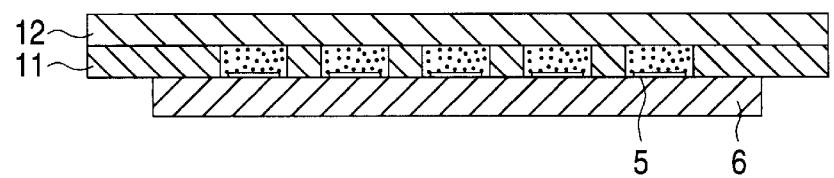
Figure 3D:
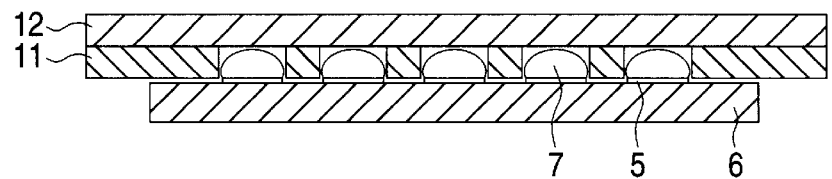
Figure 3E:
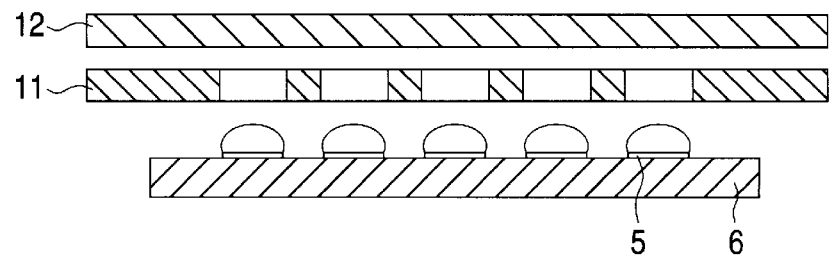

As shown in FIG. 3A, through-holes 9 of a masking member 11 are aligned to electrodes 5 on an LSI chip 6 and, as shown in FIG. 3B, solder paste 3 is charged by using a squeegee 4. Further, as shown in FIG. 3C, a supporting member 12 is superimposed on the masking member 11 and the lamination is heated by using a hot plate heated to 240° C., so that the solder paste 3 is heated/melted to make the electrodes 5 on the LSI chip 6 wet with solder to thereby form bumps 7 as shown in FIG. 3D.

In this embodiment, there is nothing charged into the through-holes 9 at the stage in-which the masking member 11 is aligned to the LSI chip 6 as shown in FIG. 3A. Accordingly, there arises an advantage that alignment can be made easily compared with Embodiment 1.

(Embodiment 3)

Figure 4:
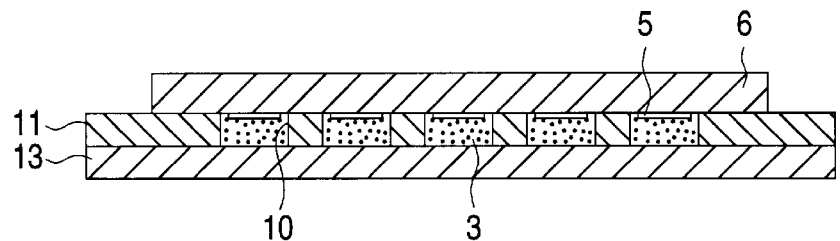
FIG. 4 is a view showing a solder supplying method according to Embodiment 3 of the present invention.

FIG. 4 is a conceptual view of a solder supplying method according to Embodiment 3.

The supporting member 13 (50 mm×50 mm×2 mm) used in this embodiment is formed from ceramics.

Ceramics are excellent in heat resistance and hardly bent when heated and have noncorrosive characteristic. Because it is however almost impossible to perform drilling or boring using etching, it is difficult to use ceramics for the masking member 11 or the transfer member 1 in FIG. 14.

Accordingly, a material which has been difficult to use conventionally can be used by providing the masking member 11 to be subjected to boring separately from the supporting member 13 having no necessity for boring as shown in FIG. 4.

Figure 5:
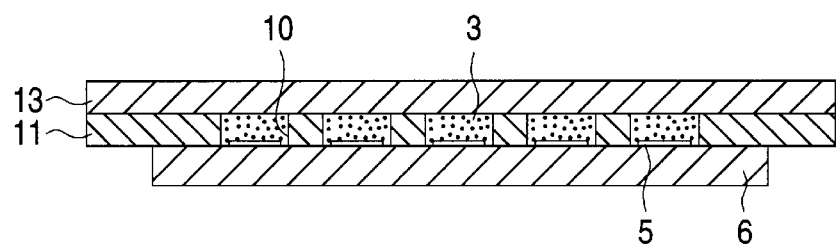
FIG. 5 is a view showing a solder supplying method according to Embodiment 3 of the present invention.

Further, as shown in FIG. 5, a ceramic supporting member 13 which is obtained by forming the supporting member 12 from ceramics can be used also in the solder supplying method according to Embodiment 2.

(Embodiment 4)

Figure 6A:
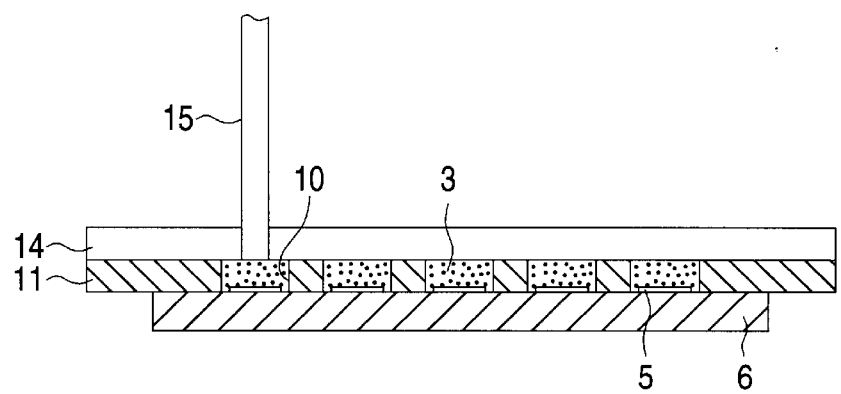
FIGS. 6A and 6B are views showing a solder supplying method according to Embodiment 4 of the present invention.
Figure 6B:
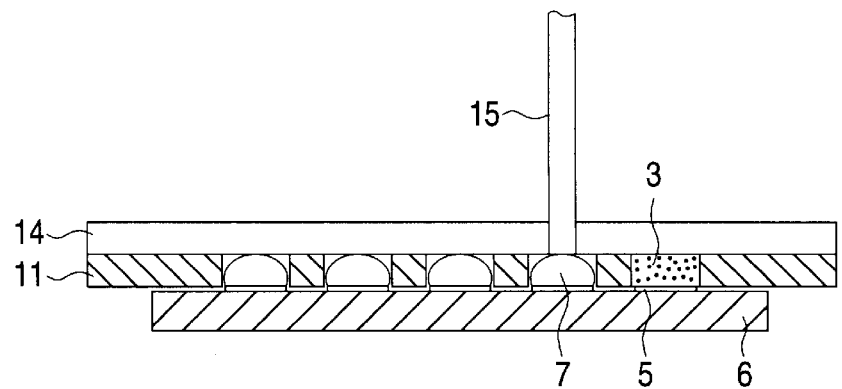

FIG. 6 is a conceptual view of a solder supplying method according to Embodiment 4;

The supporting member 14 (50 mm×50 mm×2 mm) used in this embodiment is formed from-glass.

The supporting member 14 of glass is used as a substitute for the supporting member 12 of SUS, aluminum, or the like, in the same process as in Embodiment 2.

In this embodiment, an YAG laser 15 is used as the heating means. The YAG laser 15 is focused up to a diameter of 0.1 mm smaller than the diameter 0.4 mm of the cavity portions 10 of the masking member 11, so that heat applied to portions other than the solder paste can be reduced remarkably. Accordingly, there arises an effect that the bending of the masking member 11, or the like, is suppressed and that any failure in formation of bumps is reduced.

When the temperature of the rear surface of the mask is measured, the temperature rises only to about 100° C. at the time of laser radiation. Furthermore, bending of the masking member 11 is hardly generated because the heating is given locally.

Further, even in the case where high-melting solder (melting point: 314° C.) such as 95Pb-5Sn is supplied, the temperature of the rear surface of the mask is about 120° C. and, accordingly, such high-melting solder can be supplied even to a glass epoxy printed-wiring substrate which cannot be used generally at a temperature of not lower than 250° C.

Although this embodiment has shown the case where the cavity portions 10 are subjected to laser radiation one by one individually, no bending is caused in the masking member 11 to an extent to cause a problem even in the case where the cavity portions 10 are scanned continuously while the laser is being emitted.

This contributes to the fact that the temperature of the masking member 11 does not rise to the degree to cause a problem because the solder paste 3 is constituted by a set of fine metal spheres and the actual laser absorption factor thereof is increased because of the diffused reflection of the laser radiated to the solder paste 3 so that the temperature of the solder paste 3 rises easily compared with the masking member 11 which is made from a smooth metal.

(Embodiment 5)

FIG. 7 is a conceptual view of a soldering method according to Embodiment 5.

In the drawing, the reference numeral 16 designates high-melting solder of a metal composition 95Pb-5Sn (melting point: 314° C.); and 17, low-melting solder of a metal composition 70In-30Pb (melting point: 174° C.).

Figure 7A:
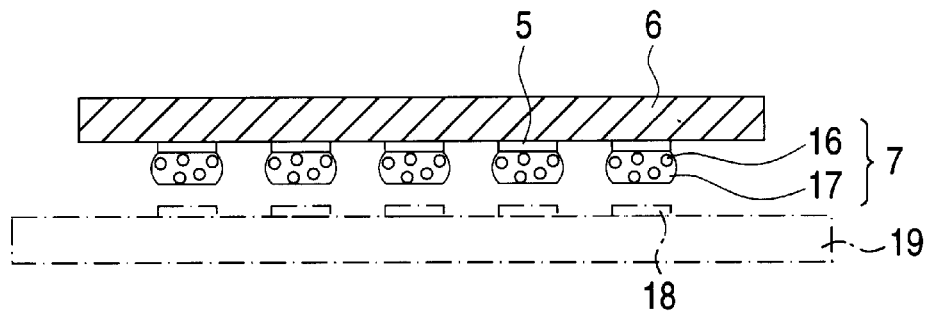
FIGS. 7A to 7C are views showing a soldering method according to Embodiment 5 of the present invention.
Figure 7B:
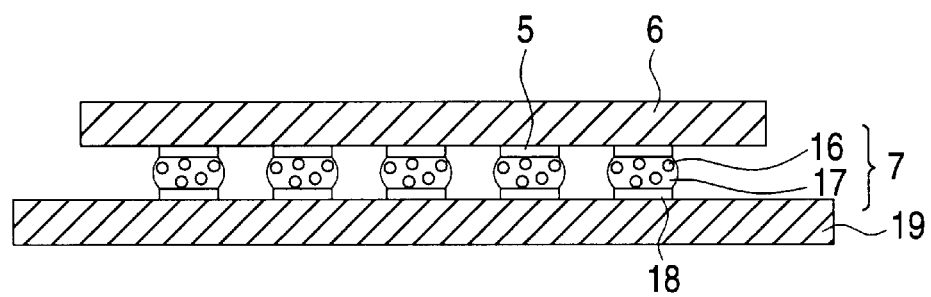
Figure 7C:
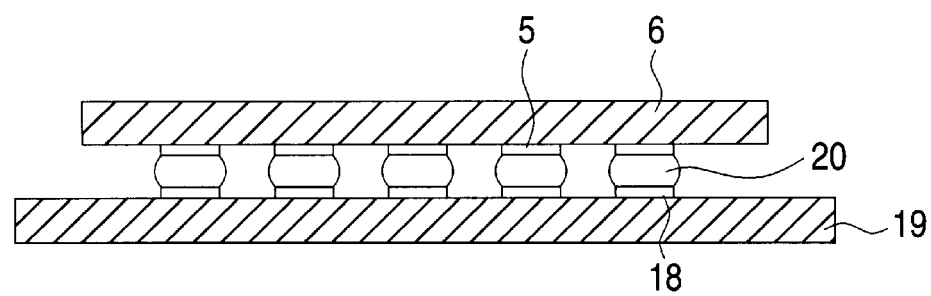

As shown in FIG. 7A, low-melting solder 17 containing dispersed fine metal particles (particle size: 25 to 40 μm) of high-melting solder 16 is supplied to electrodes 5 of an LSI chip 6, so that bumps 7 are formed as a whole. As shown in FIG. 7B, electrodes 18 provided on a printed-wiring substrate 19 correspondingly to the electrodes 5 on the LSI chip 6 are aligned so as to correspond to the electrodes 5 on the LSI chip 6 and soldering is performed by using a hot plate at 220° C. As shown in FIG. 7C, soldered joint portions 20 having a uniform composition containing dispersed high-melting solder 16 and low-melting solder 17 are formed.

In this embodiment, because the quantity ratio of high-melting solder 16 to low-melting solder 17 is set to be 1:1, the metal composition of the soldered joint portions 20 is 62.5Pb-35In-2.5Sn and has a melting point of 270 to 280° C.

Further, the combination of high-melting solder 16 and low-melting solder 17 is not limited to the specific embodiment. For example, Sn-Pb solder, or the like, is also suitable.

Further, in the case where the joint portions 20 are to be formed by soldering, heating at a temperature higher than the melting point of the low-melting solder 17 may be performed to fix the electrodes 5 on the LSI chip 6 and the electrodes 18 on the printed-wiring substrate 19 to each other and then heating at a temperature higher than the melting point of the high-melting solder 16 may be performed so that the soldered joint portions 20 can be formed.

FIG. 8 is a view showing a bump producing procedure used in Embodiment 5.

Figure 8A:
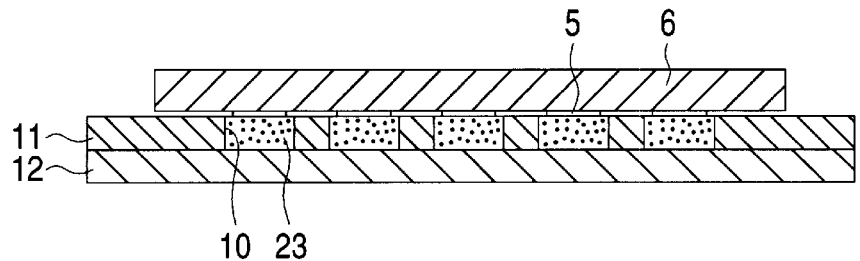
FIGS. 8A to 8D are views showing a solder supplying method according to Embodiment 5 of the present invention.
Figure 8B:
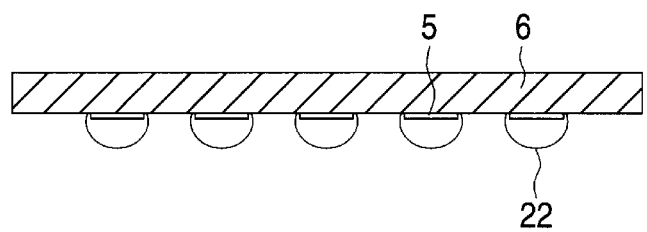

First, as shown in FIG. 8A, solder paste 23 of low-melting metal 17 is charged into cavity portions 10 in the same manner as in Embodiment 2 (or Embodiment 1) by using a masking member 11 with a thickness of 75 μm, an LSI chip 6 is positioned so that electrodes 5 on the LSI chip 6 correspond to the cavity portions 10, and heating is performed by using a hot plate at 220° C., so that bump bases 22 of low-melting metal 17 are formed as shown in FIG. 8B.

Figure 8C:
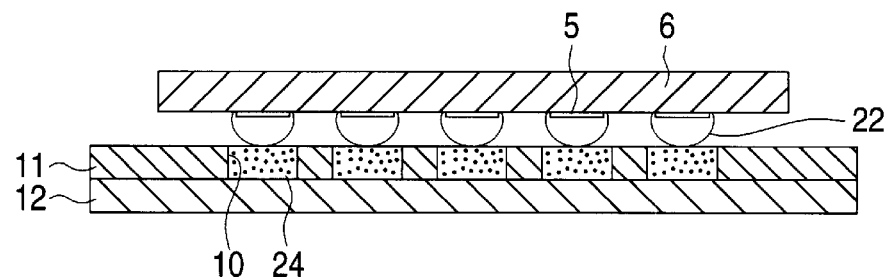
Figure 8D:
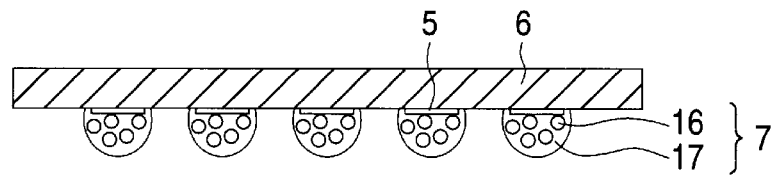

Then, as shown in FIG. 8C, solder paste 24 of high-melting metal 16 is charged into the cavity portions 10 by using the 75 μm-thick masking member 11, the LSI chip 6 provided with the bump bases 22 of low-melting metal 17 is positioned, and heating is performed by using the hot plate at 220° C. to take particles of the high-melting metal 16 into the bump bases 22, so that bumps 7 are formed as shown in FIG. 8D.

Although solder paste containing two kinds of metals having different melting points in advance has been proposed in the Unexamined Japanese Patent Application Publication No. Hei. 1-266987, coexistence of the two metals in the paste makes mutual diffusion between metals progress even at the ordinary temperature in a period of from the point of time when the paste is produced to the point of time when the paste is used, so that it may be impossible to use the paste as solder paste because of the occurrence of disadvantages such as conglutination of metal particles, or the like.

Further, in the case where the respective metal particles are mixed insufficiently, there is a possibility that the proportion of the respective metal particles varies in accordance with the cavity portions 10 to be filled so that a desired melting point cannot be obtained.

Further, the quantity proportion of low-melting metal 17 and high-melting metal 16 can be changed freely by forming the bumps 7 in the manner as shown in this embodiment so that soldered joint portions 20 having a desired melting point can be formed.

(Embodiment 6)

Figure 9A:
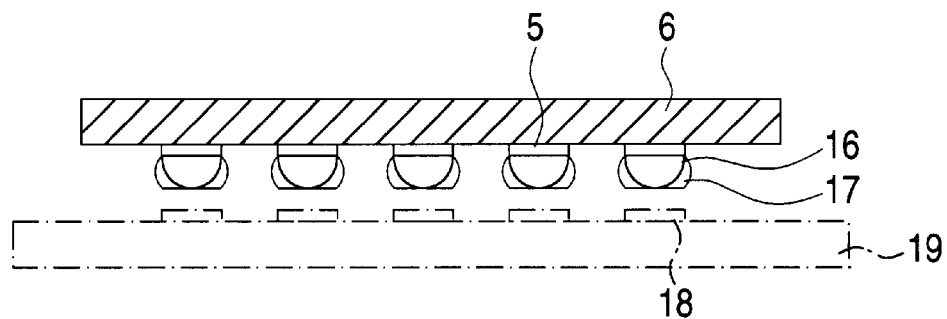
FIGS. 9A to 9C are views showing a soldering method according to Embodiment 6 of the present invention.
Figure 9B:
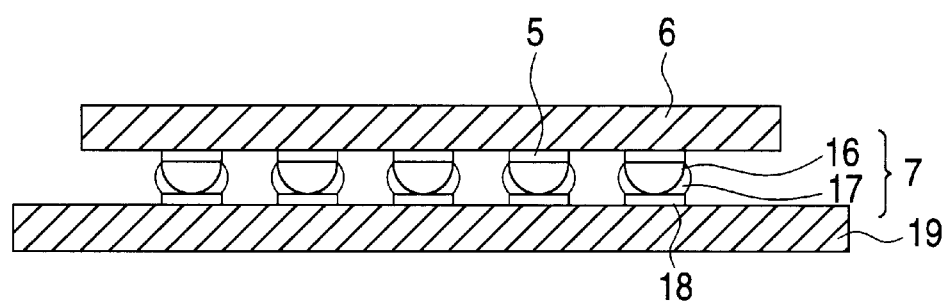
Figure 9C:
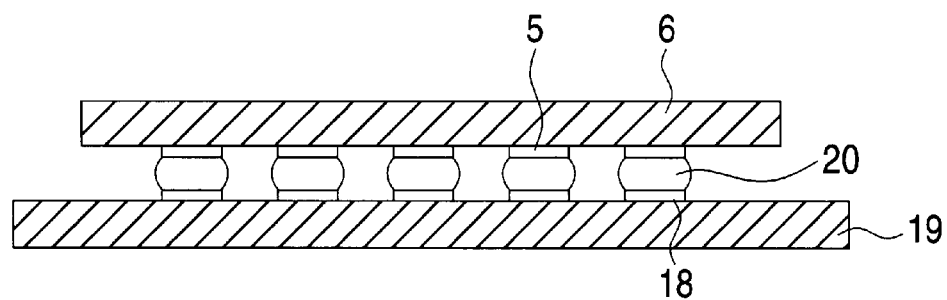

FIGS. 9A to 9C are conceptual view of a soldering method according to Embodiment 6.

In the drawing, the reference numeral 16 designates high-melting solder of a metal composition 95Pb-5Sn (melting point: 314° C.); and 17, low-melting solder of a metal composition 70In-30Pb (melting point: 174° C.).

As shown in FIG. 9A, bumps 7 each having such a structure as the outside of high-melting solder 16 is enclosed in low-melting solder 17 are formed on electrodes 5 of an LSI chip 6. As shown in FIG. 9B, electrodes 18 provided on a printed-wiring substrate 19 correspondingly to the electrodes 5 on the LSI chip 6 are aligned so as to correspond to the electrodes 5 on the LSI chip 6 and soldering is performed by using a hot plate at 220° C. As shown in FIG. 9C, soldered joint portions 20 having a uniform composition containing dispersed high-melting solder 16 and low-melting solder 17 are formed.

It is generally said that the effect of relaxing stress generated by linear thermal expansion coefficient difference between the LSI chip and the printed-wiring substrate increases as the height of the soldered joint portions increases.

In this embodiment, because the high-melting metal 16 is not melted at the point of time of soldering, the high-melting metal 16 plays a role of limiting the height of the soldered joint portions 20.

Further, in the case where the joint portions 20 are to be formed by soldering, heating at a temperature higher than the melting point of the low-melting solder 17 may be performed to fix the electrodes 5 on the LSI chip 6 and the electrodes 18 on the printed-wiring substrate 19 to each other and then heating at a temperature higher than the melting point of the high-melting solder 16 may be performed so that the soldered joint portions 20 can be formed.

FIG. 10 is a view showing a bump producing procedure used in Embodiment 6.

Figure 10A:
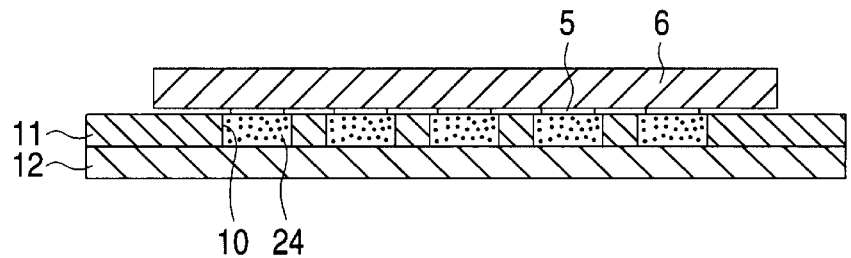
FIGS. 10A to 10D are views showing a solder supplying method according to Embodiment 6 of the present invention.
Figure 10B:
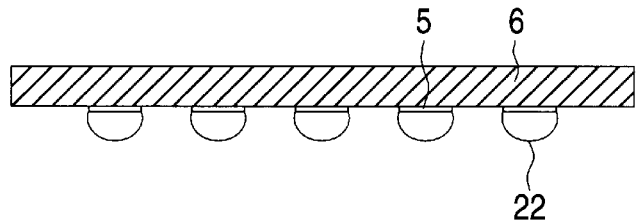

First, as shown in FIG. 10A, solder paste 24 of high-melting metal 16 is charged into cavity portions 10 in the same manner as in Embodiment 2 (or Embodiment 1) by using a masking member 11 with a thickness of 75 $\mu$m, an LSI chip 6 is positioned so that electrodes 5 on the LSI chip 6 correspond to the cavity portions 10, and heating is performed by using a hot plate at 360° C., so that bump bases 22 of high-melting metal 16 are formed as shown in FIG. 10B.

Figure 10C:
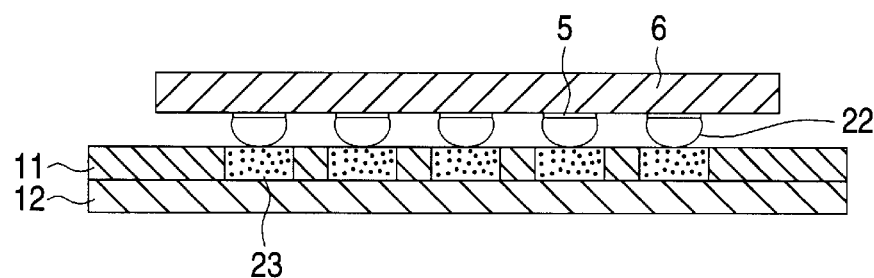
Figure 10D:
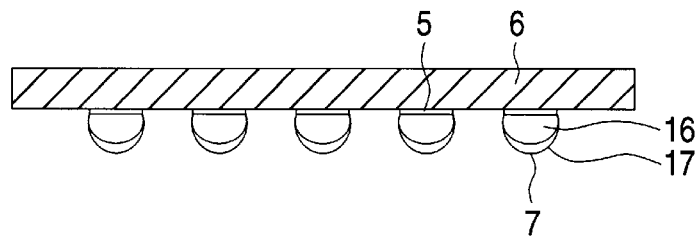

Then, as shown in FIG. 10C, solder paste 23 of low-melting metal 17 is charged into the cavity portions 10 by using the 75 $\mu$m-thick masking member 11, the LSI chip 6 provided with the bump bases 22 of high-melting metal 16 is is positioned, and heating is performed by using the hot plate at 220° C. to cover the high-melting metal 16 with the low-melting metal 17, so that bumps 7 are formed as shown in FIG. 10D.

Figure 11:
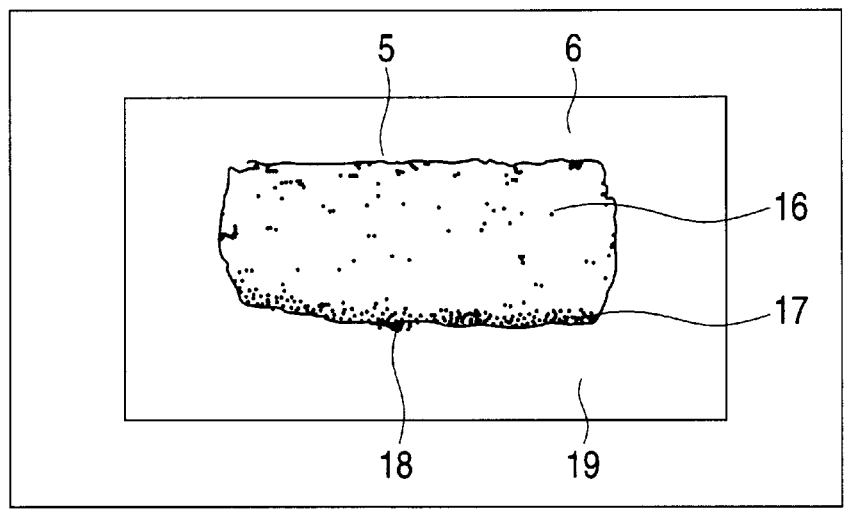
FIG. 11 is a view showing a joint portion after soldering according to Embodiment 6 of the present invention.

FIG. 11 is a view showing a joint portion after soldering in Embodiment 6.

A thin layer of low-melting metal 17 can be observed in the lower side of the joint portion. Further, this layer is made to disappear gradually by continuing heating at 220° C., so that the melting point of the whole joint portion rises to a temperature of not lower than 270° C.

FIG. 12 is a conceptual view of a semiconductor device producing procedure obtained by applying the soldering method of Embodiment 6.

Figure 12A:
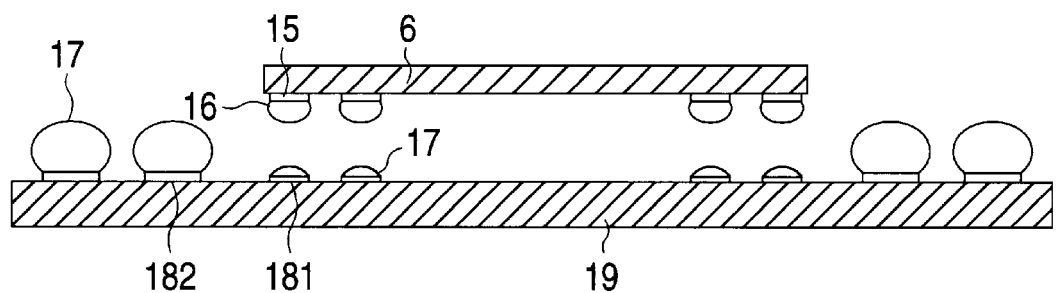
FIGS. 12A and 12B are views showing a soldering method according to Embodiment 6 of the present invention.

As shown in FIG. 12A, LSI connection electrodes 181 corresponding to electrodes 5 of an LSI chip 6 and external electrodes 182 are formed on a printed-wiring substrate 19. Low-melting metal 17 is supplied to the respective electrodes 181 and 182 by the method of Embodiment 2 (or Embodiment 1).

Figure 12B:
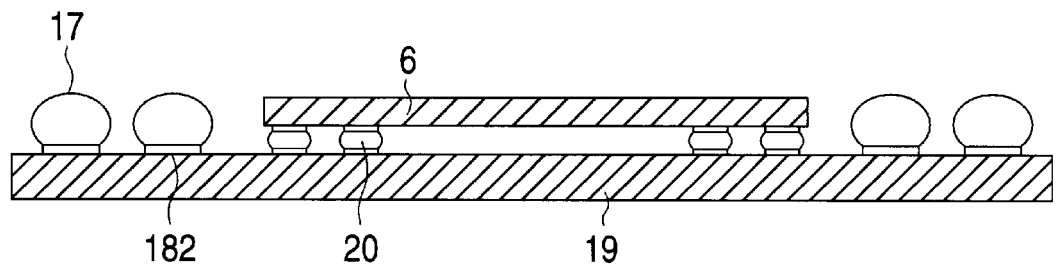

As shown in FIG. 12B, the LSI chip 6 supplied with the high-melting metal 16 by the method of Embodiment 2 (or Embodiment 1) is positioned and soldering is performed by using a hot plate at 220° C.

The low-melting metal 17 supplied to the external electrodes 182 can be used as a joint material when a semiconductor device is mounted on a mother substrate of an electronic appliance. It is therefore preferable that the low-melting metal 17 is formed so as to be higher than the LSI chip 6.

Figure 13:
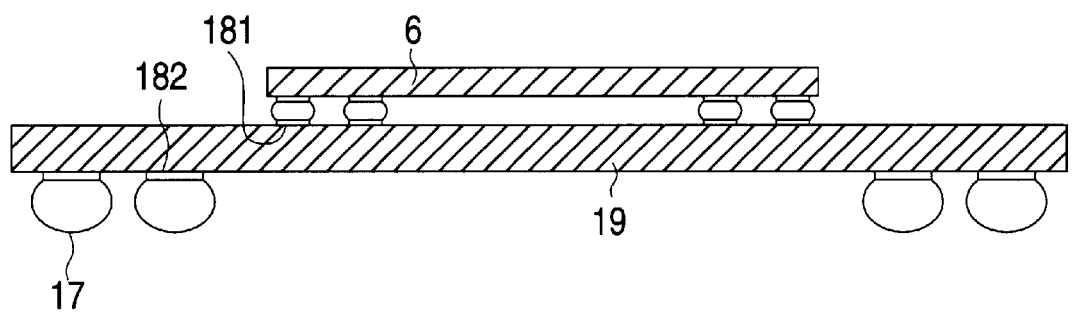
FIG. 13 is a view showing a soldering method according to Embodiment 6 of the present invention.

Further, as shown in FIG. 13, this embodiment can be applied to a semiconductor device having external electrodes 182 formed on one surface of the printed-wiring substrate 19 opposite to the other surface on which the LSI chip 6 is mounted.

Further, in the case where the joint portions 20 are to be formed, heating at a temperature higher than the melting point of low-melting solder 17 may be performed and then heating at a temperature higher than the melting point of high-melting solder 16 may be performed so that the soldered joint portions 20 can be formed.

(Embodiment 7)

FIGS. 14A to 14E are conceptual views of a solder supplying method according to Embodiment 7.

The masking member 11 is a 50 mm×50 mm×0.15 mm SUS plate having 1024 through-holes 9 of a 0.4 mm diameter (0.5 mm pitch, 32×32 matrix) formed in the central portion by etching.

A sheet-like member 25 as the supporting member is formed from an adhesive polyimide tape having a thickness of 100 $\mu$m and cut into a size of 20 mm×20 mm.

Further, the LSI chip 6 is made from a dummy chip having aluminum wiring formed on a 16 mm×16 mm×0.4 mm silicon wafer. Electrodes 5 of 1024 provided on a surface of the LSI chip 6 are surface-treated with titanium-tungsten, nickel and gold.

Figure 14A:
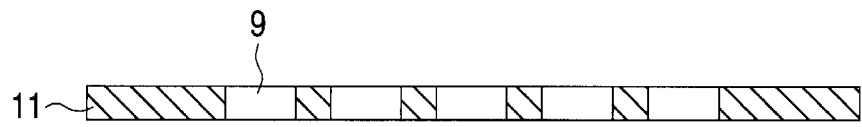
FIGS. 14A to 14E are views showing a solder supplying method according to Embodiment 7 of the present invention.
Figure 14B:
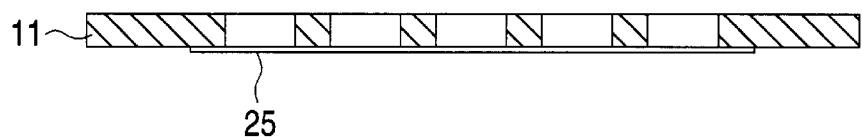

As shown in FIG. 14B, the sheet-like member 25 is stuck to the mask 11 of FIG. 14A.

Figure 14C:
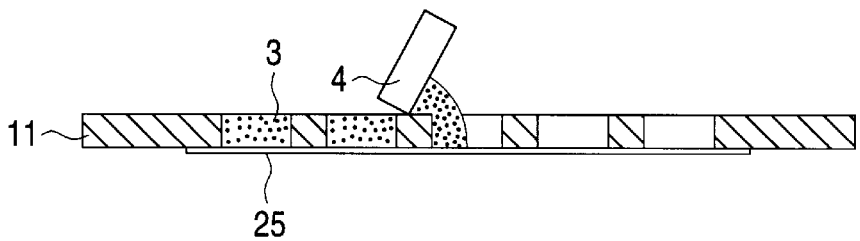

Then, as shown in FIG. 14C, cavity portions 10 are filled with solder paste 3 (63GK-110GP-L, 63Sn-37Pb eutectic type, melting point 183° C., made by Nihon Genma) by using a squeegee 4.

Figure 14D:
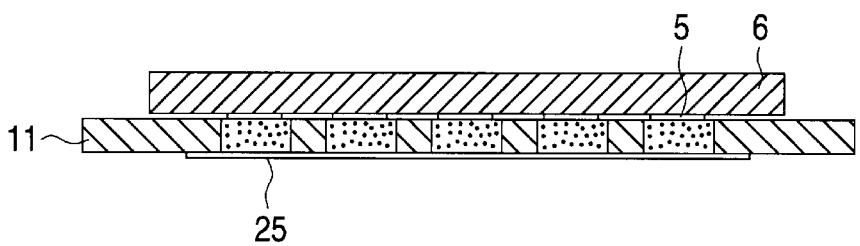
Figure 14E:
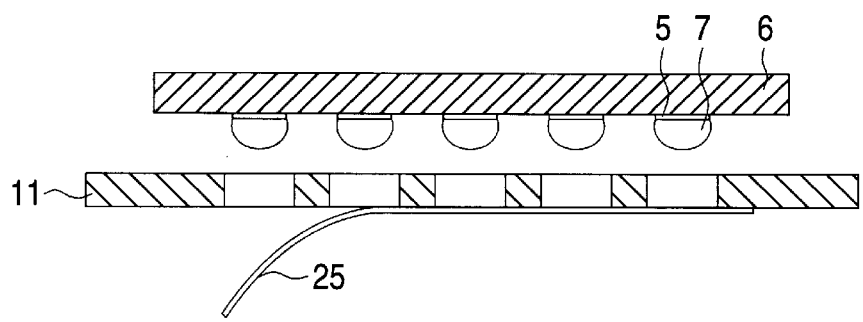

Then, as shown in FIG. 14D, the electrodes 5 of the LSI chip 6 and the through-holes 9 are aligned and heated by using a hot plate heated to 240° C., so that the solder paste 3 is heated/melted to make the electrodes 5 wet with solder to thereby form bumps 7 as shown in FIG. 14E.

By sticking the sheet-like member to the masking member, solder paste can be prevented from projecting out in the rear side of the masking member when squeezing (charging) is performed.

(Embodiment 8)

FIG. 15 is a conceptual view of a solder supplying method according to Embodiment 8.

The masking member 111 is a 50 mm×50 mm×0.15 mm SUS430 plate of a magnetic substance having 1024 through-holes 9 of a 0.4 mm diameter (0.5 mm pitch, 32×32 matrix) formed in the central portion by etching.

The supporting member 121 is a 50 mm×50 mm×3 mm SUS430 plate of a magnetic substance.

The magnet 26 is a permanent magnet with a diameter of 40 mm and a thickness of 5 mm.

The LSI chip 6 is the same as in Embodiment 7 shown in FIG. 14 and the description thereof will be omitted.

Figure 15A:
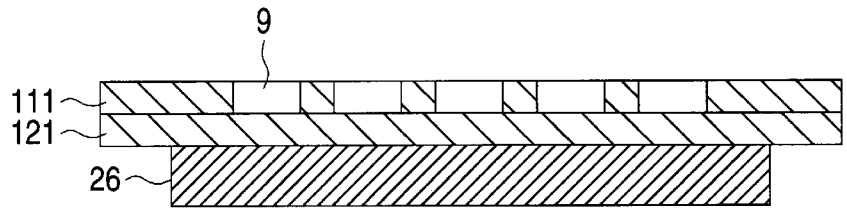
FIGS. 15A to 15D are views showing a solder supplying method according to Embodiment 8 of the present invention.
Figure 15B:
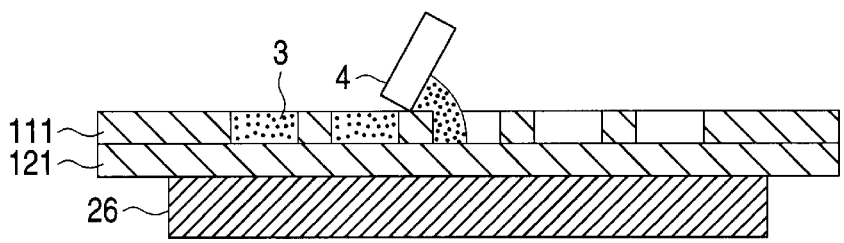

As shown in FIG. 15A, the masking member 111, the supporting member 121 and the magnet 26 are superimposed and fixed one upon another, and as shown in FIG. 15B, through-holes are filled with solder paste 3 (63GK-110GP-L, 63Sn-37Pb eutectic type, melting point 183° C., made by Nihon Genma) by using a squeegee 4.

Figure 15C:
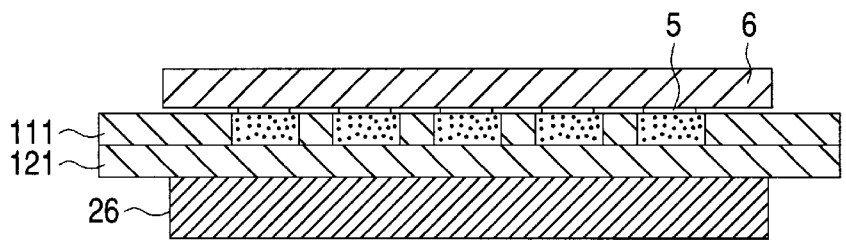
Figure 15D:
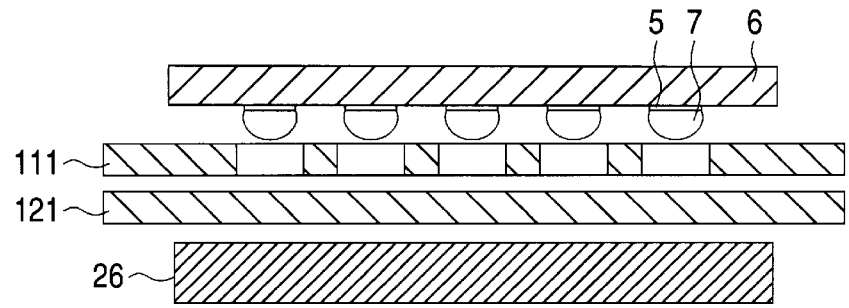

Then, as shown in FIG. 15C, the electrodes 5 of the LSI chip 6 and the through-holes 9 are aligned and heated by using a hot plate heated to 240° C., so that the solder paste 3 is heated/melted to make the electrodes 5 wet with solder to thereby form bumps 7 as shown in FIG. 15D.

As described above, a magnetic substance SUS430 is used as a material for the masking member 111 and the supporting member 121, and the magnet 26 is superimposed on the supporting member 121 so that the masking member 111 can be made to adhere closely to the supporting member 121 by magnetic force so that such a failure of flowing-out of solder paste into a gap between the masking member and the supporting member can be prevented at the time of squeezing.

Although the above description has been made upon the case where both the masking member 111 and the supporting member 121 are made from a magnetic substance such as SUS430, or the like, only the masking member 111 may be made from a magnetic substance.

In this case, because the masking member 111 is sucked by the magnetic force of the magnet 26, the masking member 111 can be made to adhere closely to the supporting member 121 so that solder paste can be prevented from projecting out of the through holes when the solder paste is charged.

(Embodiment 9)

Figure 16:
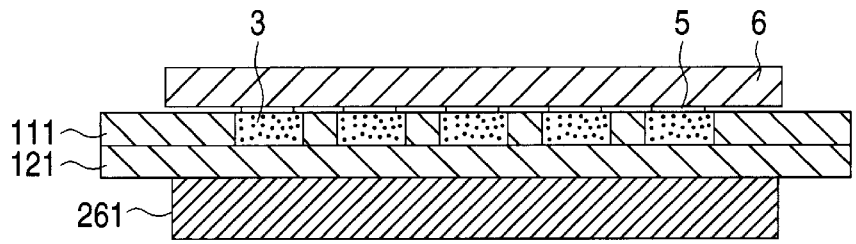
FIG. 16 is a view showing a solder supplying method according to Embodiment 9 of the present invention.

FIG. 16 is a conceptual view of a solder supplying method according to Embodiment 9.

The electromagnet 261 is the same as in Embodiment 8 except that the electromagnet 261 has a diameter of 40 mm and a thickness of 5 mm.

Because the electromagnet 261 can turn on/off the generation of magnetic force, the masking member 111 can be separated from the supporting member 121 easily after the formation of bumps.

(Embodiment 10)

Figure 17:
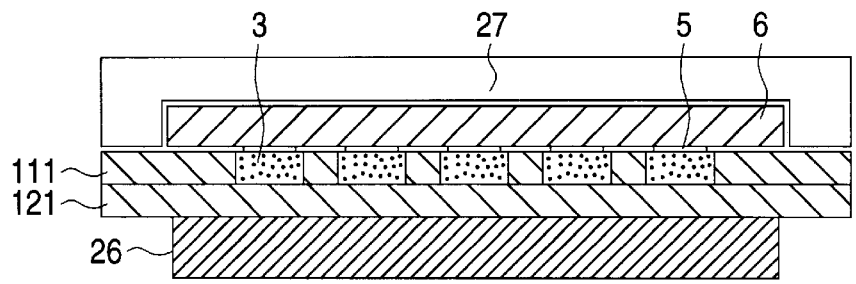
FIG. 17 is a view showing a solder supplying method according to Embodiment 10 of the present invention.

FIG. 17 is a conceptual view of a solder supplying method according to Embodiment 10.

The pressing jig 27 is formed from SUS430 having a size 50 mm×50 mm×5 mm. In the pressing jig 27, a 16.2 mm×16.2 mm opening portion with a depth of 0.5 mm is formed so as to put the LSI chip 6 therein.

By pressing the masking member 111 from the upper portion through the pressing jig 27 to make the masking member 111 and the supporting member 121 adhere closely to each other, the state of close adhesion of the masking member 111 and the supporting member 121 can be kept even in the case where the magnet 26 is degaussed at the time of heating. Accordingly, any failure of flowing-out of solder paste can be prevented.

The reason why a magnetic substance SUS430 is used for the pressing jig 27 is that it contributes to suppress a failure due to a difference in linear thermal expansion coefficient between the pressing jig 27 and each of the masking member 111 and the supporting member 121, because those members 111 and 121 are made from SUS430. Alternatively, a nonmagnetic substance may be used for the pressing jig 27.

(Embodiment 11)

Figure 18A:
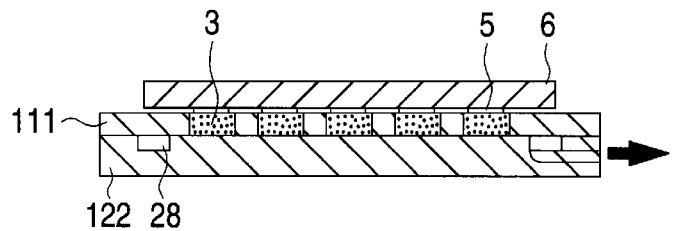
FIGS. 18A and 18B are views showing a solder supplying method according to Embodiment 11 of the present invention.
Figure 18B:
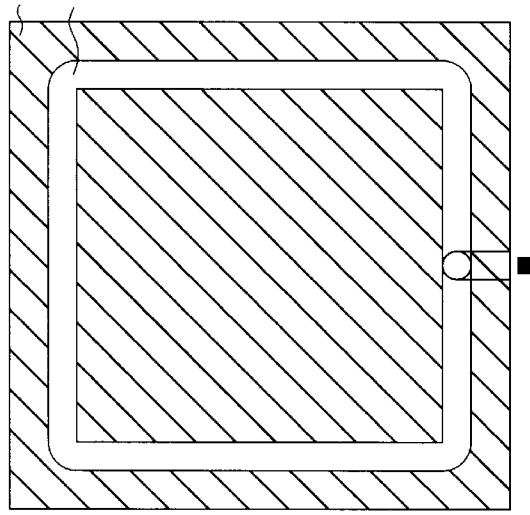

FIG. 18 is a conceptual view of a solder supplying method according to Embodiment 11.

A groove 28 with a width of 2 mm and a depth of 1 mm is annularly formed in the form of an about 40 mm×40 mm circuit in the supporting member 122 so as to be evacuated from a side.

By the evacuation, the masking member 111 is sucked to the supporting member 121 so that the two members 111 and 121 can be made to adhere closely to each other. Accordingly, solder paste can be prevented from projecting out when the solder paste is charged.

(Embodiment 12)

Figure 19:
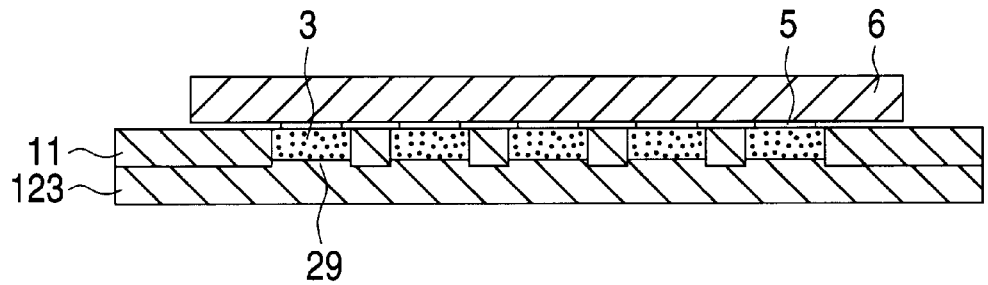
FIG. 19 is a view showing a solder supplying method according to Embodiment 12 of the present invention.

FIG. 19 is a conceptual view of a solder supplying method according to Embodiment 12.

The masking member 11 is a 50 mm×50 mm×0.15 mm SUS plate having 1024 through-holes of a 0.4 mm diameter (0.5 mm pitch, 32×32 matrix) formed in the central portion by etching and is the same as in Embodiment 1.

The supporting member 123 is a 50 mm×50 mm×3 mm SUS plate provided with projecting portions 29 each having a diameter of 0.38 mm and a height of 0.03 mm.

By these projecting portions 29, any gap can be hardly generated between the masking member 11 and the supporting member 123. Accordingly, any failure of flowing-out of solder paste can be prevented.

(Embodiment 13)

Figure 20:
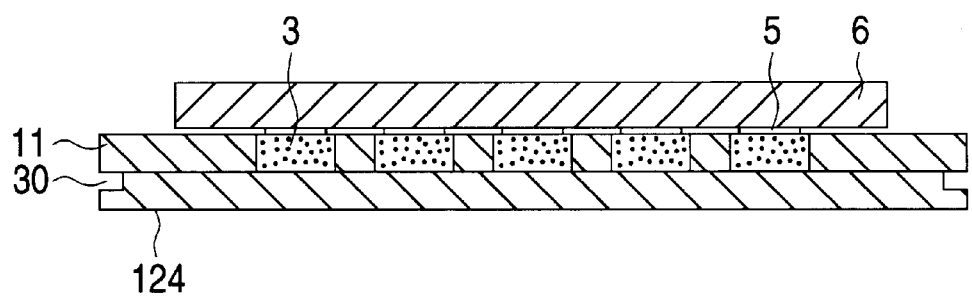
FIG. 20 is a view showing a solder supplying method according to Embodiment 13 of the present invention.

FIG. 20 is a conceptual view of a solder supplying method according to Embodiment 13.

In the supporting member 124, a cutaway portion 30 with a width of 2 mm and a depth of 1 mm is provided along the outer circumference of the supporting member 124. The cutaway portion 30 corresponds to an end portion of the masking member 11.

Although burrs may be generated in the end portion of the masking member 11 in accordance with the producing method, the provision of such a cutaway portion 30 can prevent a gap from being generated between the masking member 11 and the supporting member 124 when burrs are generated in the masking member 11.

(Embodiment 14)

Figure 21:
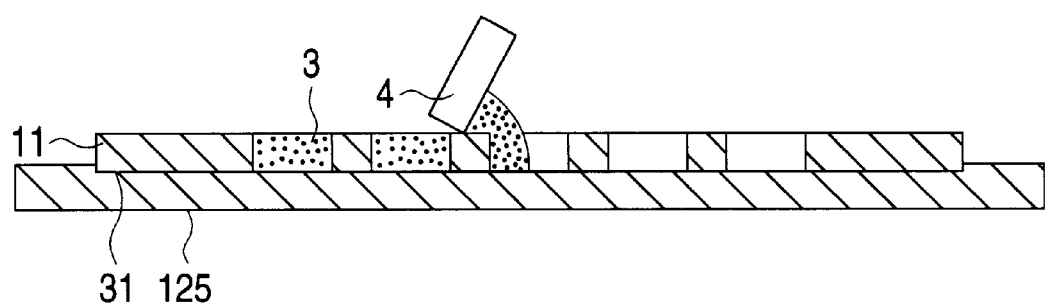
FIG. 21 is a view showing a solder supplying method according to Embodiment 14 of the present invention.
Figure 22A:
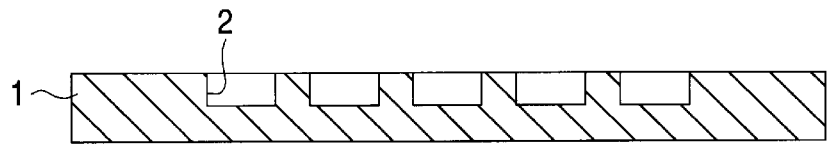
FIGS. 22A to 22D are views showing a conventional bump forming method.
Figure 22B:
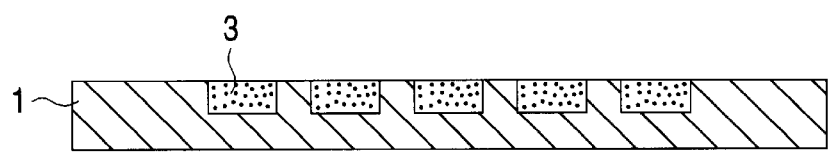
Figure 22C:
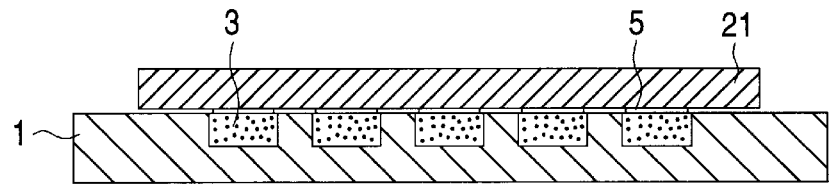
Figure 22D:
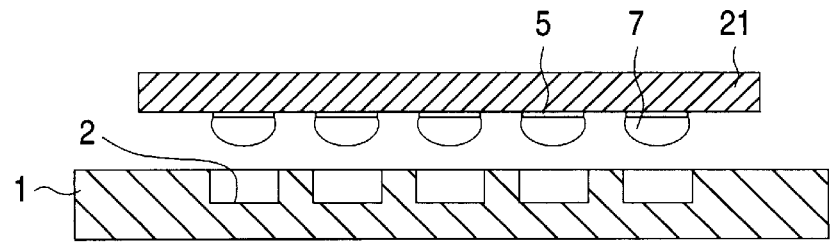
Figure 23:
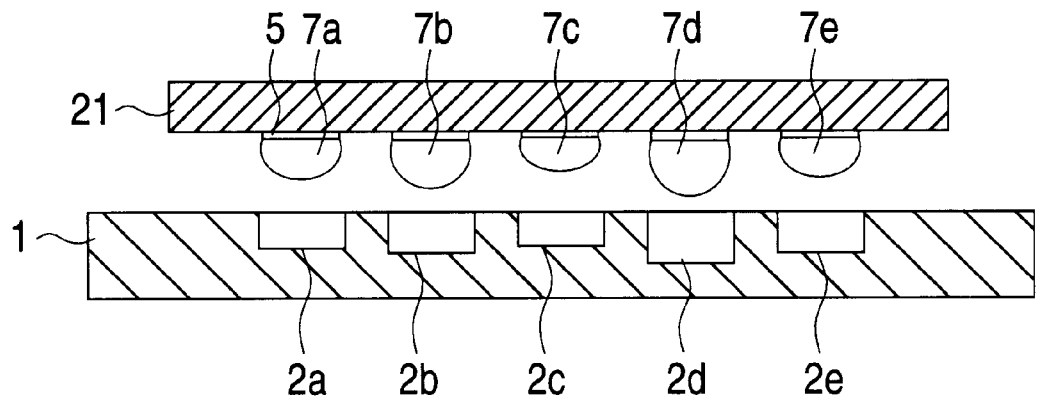
FIG. 23 is a view showing a conventional bump forming method.
Figure 24:
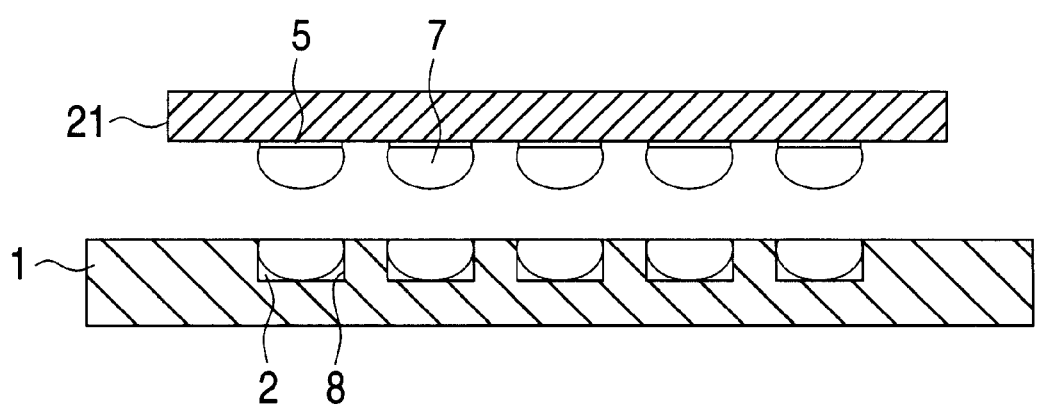
FIG. 24 is a view showing a conventional bump forming method.

FIG. 21 is a conceptual view of a solder supplying method according to Embodiment 14.

The supporting member 125 is a 60 mm×60 mm×3 mm SUS plate in which a 50.2 mm×50.2 mm opening portion 31 is formed to have a depth of 0.05 mm so that the mask 11 can be put in the opening portion 31.

By the provision of the opening portion 31 for receiving the masking member 11 therein, the masking 11 can be prevented from being displaced relative to the supporting member 125 at the time of squeezing.

As described above, in the solder supplying method and the solder supplying apparatus according to the present invention, bumps little in variety of the height thereof can be formed by using a masking member having through-holes. Accordingly, there arises an effect that the cleaning time after the formation of the bumps can be shortened and that the increase of cost caused by the increase of the number of bumps can be suppressed.

Furthermore, the masking member can be made to adhere closely to the supporting member by magnetic force by using a magnetic substance as a material for the masking member and the supporting member and superimposing the magnet on those members. Accordingly, any failure of flowing-out of solder paste into a gap between the masking member and the supporting member can be prevented at the-time of squeezing.

Furthermore, in the soldering method according to the present invention, bumps are formed by using solder paste containing a first metal having a predetermined melting point and solder paste containing a metal having a melting point different from the melting point of the first metal. Accordingly, there arises an effect that the soldering temperature of the joint portion requiring high heat resistance can be reduced.

What is claimed is:

1. A solder supplying method comprising the steps of:

superimposing a masking member having a thickness and having a plurality of through-holes corresponding to a plurality of electrodes formed on an electronic component onto a supporting member so that said supporting member covers said plurality of through-holes;

filling cavity portions formed by said plurality of through-holes and said supporting member with solder paste;

disposing said electronic component and said masking member so that said plurality of electrodes are superimposed onto said plurality of cavity portions, respectively; and heating said solder paste to make said solder paste deposit on said plurality of electrodes;

wherein said solder paste has a height that is larger than the thickness of the masking member when the solder paste is melted.

2. A solder supplying apparatus comprising:

a masking member having a plurality of through-holes corresponding to a plurality of electrodes formed on an electronic component;

a supporting member superimposed on said masking member so as to cover said plurality of through-holes;

means for charging solder paste into cavity portions formed by said plurality of through-holes and said electronic component or said supporting member;

means for disposing said masking member and said electronic component so that said plurality of electrodes are superimposed in said plurality of cavity portions or said plurality of through-holes, respectively; and a heating means for heating said solder paste so as to make said solder paste deposit on said plurality of electrodes, wherein said masking member is provided as a member of a magnetic substance so that said apparatus comprises:

means for giving magnetic force to said masking member from one side of said supporting member opposite to other side thereof on which said masking member is superimposed to make said masking member and said supporting member adhere closely to each other, or each of said masking member and said supporting member is provided as a member of a magnetic substance so that said apparatus comprises:

means for giving magnetic force to said masking member and said supporting member superimposed on each other to make said masking member and said supporting member adhere closely to each other.

3. The solder supplying apparatus of claim 2, wherein said means for giving magnetic force to make said masking member and said supporting member adhere closely to each other is designed to give magnetic force by using a permanent magnet or an electromagnet.

4. The solder supplying apparatus of claim 2, further comprising:

means for pressing said masking member and said supporting member by using a pressing member to hold a close adhesion state.

5. A solder supplying apparatus comprising:

a masking member having a thickness and having a plurality of through-holes corresponding to a plurality of electrodes formed on an electronic component;

a supporting member superimposed on said masking member so as to cover said plurality of through-holes;

means for charging solder paste into cavity portions formed by said plurality of through-holes and said electronic component or said supporting member, such that said solder paste has a height that is larger than the thickness of the masking member when the solder paste is melted;

means for disposing said masking member and said electronic component so that said plurality of electrodes are superimposed in said plurality of cavity portions or said plurality of through-holes, respectively; and a heating means for heating said solder paste so as to make said solder paste deposit on said plurality of electrodes.

6. The solder supplying apparatus of claim 5, wherein said supporting member is formed from ceramics.

7. The solder supplying apparatus of claim 5, wherein said supporting member is provided as a heat-resistant sheet member, and said means for charging solder paste is provided as means for sticking said sheet member onto said masking member and filling cavity portions formed by said plurality of through-holes of said masking member and said supporting member with solder paste.

8. The solder supplying apparatus of claim 5, further comprising:

a heat-resistant member disposed between said masking member and said supporting member so as to be filled in a gap between said masking member and said supporting member.

9. The solder supplying apparatus of claim 5, wherein said masking member and said supporting member are formed from raw materials different from each other, respectively.

10. The solder supplying apparatus of claim 5, wherein said supporting member is provided as a member having an opening portion for absorbing said masking member, and said means for charging solder paste is provided as means for evacuating said opening portion to make said masking member and said supporting member adhere closely to each other to charge solder paste into cavity portions formed by said plurality of through-holes of said masking member and said supporting member.

11. The solder supplying apparatus of claim 5, wherein said supporting member is provided as a member having projecting portions formed at positions corresponding to said plurality of through-holes of said masking member so that no gap is generated in cavity portions formed by said projecting portions and said through-holes when said masking member and said supporting member are superimposed on each other.

12. The solder supplying apparatus of claim 5, wherein said supporting member is provided as a member having a portion lowered in level correspondingly to an end portion of said masking member so that said end portion of said masking member does not abut on said supporting member when said masking member and said supporting member are superimposed on each other.

13. The solder supplying apparatus of claim 5, wherein said supporting member is provided as a member having a recess portion to be in contact with said masking member so that no displacement is generated between said masking member and said supporting member when said masking member and said supporting member are superimposed on each other.

14. The solder supplying apparatus of claim 5, wherein said supporting member is a member having permeability of heating beams.

15. The solder supplying apparatus of claim 14, wherein said solder paste heating means is constituted by a heating beam radiator.

* * * * *